United States Patent [19]
Hashizume et al.

[11] Patent Number: 5,911,039
[45] Date of Patent: Jun. 8, 1999

[54] INTEGRATED CIRCUIT DEVICE COMPRISING A PLURALITY OF FUNCTIONAL MODULES EACH PERFORMING PREDETERMINED FUNCTION

[75] Inventors: Takeshi Hashizume; Kazuhiro Sakashita, both of Hyogo-ken, Japan

[73] Assignee: Mitsubishi Denki Kabushiki Kaisha, Tokyo, Japan

[21] Appl. No.: 08/787,333

[22] Filed: Jan. 27, 1997

Related U.S. Application Data

[63] Continuation of application No. 08/218,856, Mar. 28, 1994, abandoned, which is a continuation of application No. 08/008,866, Jan. 25, 1993, which is a continuation of application No. 07/556,542, Jul. 24, 1990, abandoned.

[30] Foreign Application Priority Data

Aug. 2, 1989 [JP] Japan .................................... 1-200632

[51] Int. Cl.⁶ .......................... G06F 11/267; G06F 11/27
[52] U.S. Cl. ............................... 395/183.06; 395/183.03; 395/311; 371/22.31; 371/22.34
[58] Field of Search .................................. 371/22.1, 22.3, 371/22.6, 25.1, 22.31, 22.34; 324/73.1, 158.1; 395/183.06, 183.09, 183.13, 183.01, 183.03, 308, 311, 800.01, 800.28, 800.32, 800.36, 800.4, 800.42, 825, 287, 728, 729, 730

[56] References Cited

U.S. PATENT DOCUMENTS

| | | | |
|---|---|---|---|
| 4,145,734 | 3/1979 | Bienvenu | 395/183.03 |
| 4,441,075 | 4/1984 | McMahon | 371/22.3 |
| 4,542,509 | 9/1985 | Buchanan et al. | 371/22.3 |
| 4,581,739 | 4/1986 | McMahon, Jr. | 371/22.3 |
| 4,597,042 | 6/1986 | d'Angeac et al. | 371/22.1 |
| 4,698,588 | 10/1987 | Hwang et al. | 324/73.1 |
| 4,701,921 | 10/1987 | Powell et al. | |
| 4,710,931 | 12/1987 | Bellay | 371/22.3 |
| 4,736,395 | 4/1988 | Sugihara | 377/29 |
| 4,833,395 | 5/1989 | Sasaki et al. | 324/763 |
| 4,856,002 | 8/1989 | Sakashita et al. | 371/22.36 |
| 4,860,290 | 8/1989 | Daniels | 371/22.3 |
| 4,864,579 | 9/1989 | Kishida et al. | 371/22.31 |
| 4,866,508 | 9/1989 | Eichdberger et al. | 361/412 |
| 4,872,169 | 10/1989 | Whetsel, Jr. | 371/22.3 |
| 4,903,270 | 2/1990 | Johnson | 371/3 |
| 5,032,783 | 7/1991 | Hwang et al. | 324/73.1 |
| 5,047,710 | 9/1991 | Mahoney | 324/537 |
| 5,173,904 | 12/1992 | Daniels | 371/22.3 |
| 5,189,675 | 2/1993 | Nozuyama | 371/22.31 |
| 5,214,655 | 5/1993 | Eichelberger | 371/22.5 |
| 5,228,139 | 7/1993 | Miwa et al. | 395/183.03 |
| 5,581,698 | 12/1996 | Miwa et al. | 395/183.18 |

FOREIGN PATENT DOCUMENTS

| | | |
|---|---|---|
| 3722615 | of 1987 | Germany . |
| 3725822 | of 1987 | Germany . |
| 56-164425 | 12/1981 | Japan . |
| 62-93672 | 4/1987 | Japan . |
| 62-174670 | 7/1987 | Japan . |

OTHER PUBLICATIONS

Japanase Office Action dated Nov. 29, 1994 and translation thereof.

*Primary Examiner*—Dieu-Minh Le
*Attorney, Agent, or Firm*—McDermott, Will & Emery

[57] ABSTRACT

An integrated circuit device is structured by a plurality of functional modules (2a, 2b) each performing a predetermined function, each functional module including a test circuit (3) for testing the corresponding module. Each test circuit comprises a scan path (3a–3d) for receiving test data from a single common input line to perform a test and outputting a test output, a tri-state buffer (4a) for controlling an output of the test output from the scan path to a single common output line, and a scan path selecting circuit (5a) for selectively driving the tri-state buffer. All the selecting circuits in the integrated circuit device are connected in series to constitute as a whole a shift register. A selecting signal of the serial data is inputted to the shift register, so that the test output of each scan path is selectively supplied to the common output line.

19 Claims, 10 Drawing Sheets

INTEGRATED CIRCUIT DEVICE COMPRISING A PLURALITY OF FUNCTIONAL MODULES EACH PERFORMING PREDETERMINED FUNCTION

This application is a continuation of application Ser. No. 08/218,856 filed Mar. 28, 1994, which is a continuation of Ser. No. 08/008,866, filed Jan. 25, 1993, which is a continuation of Ser. No. 07/566,542, filed Jul. 24, 1990, all now abandoned.

BACKGROUND OF THE INVENTION

1. Field of the Invention

The present invention relates generally to integrated circuit devices, and more particularly, to an integrated circuit device comprising a plurality of functional modules each having a test circuit.

2. Description of the Background Art

In a conventional integrated circuit device, one functional module such as a random access memory (RAM), a read only memory (ROM), an arithmetic logic unit (ALU) or a programmable logic array (PLA) is generally implemented on a single chip, and this allows test data to be inputted/outputted into/from the module directly from the outside of the chip. As a result, a function test is easily performed.

However, as integrated circuits are made larger in scale in recent years, a so-called structured design method for building block has been employed in many cases, as a manner of designing a large scaled integrated circuit, which allows chip as a whole to have desired functions, by designing individual functional modules each having its own subfunction and then arranging a combination of a plurality of the functional modules thus designed on the chip. In the integrated circuit device having a plurality of functional modules arranged on a single chip, it is effective to perform a function test for a subfunction of each functional module as a design unit. Although for testing subfunction of each functional module, there is a method of forming a scan path having all shift register latches (SRL) connected in series each provided at an input/output node as a test point of each module to serially and externally input and output test data in/from the scan path, the method requires a scan path to be longer when the number of modules is large, making it difficult to test the functional modules quickly. As a solution of this problem, the scan path may be divided, one for each functional module, so that test data is directly and externally inputted/outputted to/from only the functional module to be tested.

Figure 9:
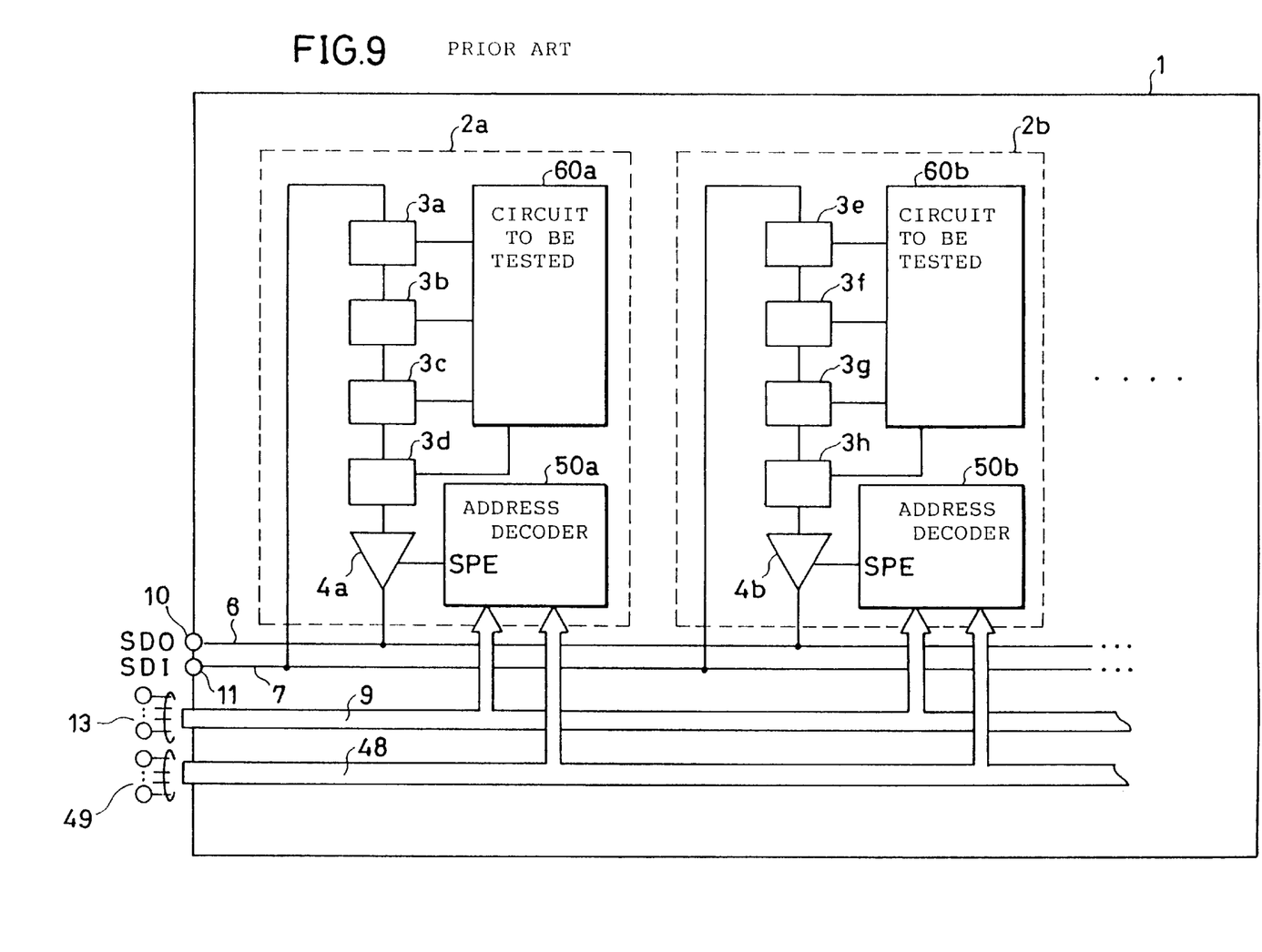
FIG. 9 is a block diagram showing the example of the conventional integrated circuit constituted by a plurality of functional modules.

FIG. 9 is diagram showing an example of the conventional integrated circuit comprised of a plurality of functional modules each including a test circuit for testing subfunction of each module as described above. First, a structure of the conventional integrated circuit will be described with reference to FIG. 9. In FIG. 9, an integrated circuit (chip) 1 comprises a plurality of functional modules 2a, 2b, . . . . In order to test the functional modules independently, a test circuit is provided for each functional module. Described in more detail, the functional module 2a comprises a test circuit including a scan path comprised of series-connected SRLs 3a, 3b, 3c and 3d, a tri-state buffer 4a connected to an output portion of the scan path and for controlling an output of the scan path, and a selection circuit 50a comprising an address decoder for controlling the tri-state buffer 4a, and a circuit 60a which subfunction is to be tested by the test circuit. Similarly, the functional module 2b comprises a test circuit including a scan path comprised of series-connected SRLs 3e, 3f, 3g and 3h, a tri-state buffer 4b connected to an output portion of the scan path and for controlling an output of the scan path, and a selection circuit 50b comprising an address decoder for controlling the tri-state buffer 4b, and a circuit 60b which subfunction is to be tested by the test circuit.

The above described scan path provided for each functional module has one end connected to a common input data signal line 7 and the other end connected to a common output data signal line 6. Test data SDI to be supplied to each functional module is inputted from the outside of the chip to the common input data signal line 7 through a test data input terminal 11 and a test data output from each functional module is outputted as a test data output SDO to the outside of the chip through the common output data signal line 6 and a test data output terminal 10.

In each functional module, a scan path enable terminal SPE of the selection circuit 50 comprising the address decoder is connected to an output control signal line of the tri-state buffer 4, so that when the selection circuit 50 is selected by an address signal which will be described later, an output of the corresponding tri-state buffer 4 enters an enable state.

An address signal line 48 is connected to each selection circuit 50 comprising an address decoder, so that an address signal inputted from the outside of the chip through an address signal input terminal 49 selects a selection circuit 50 of any of the test circuits.

On the other hand, scan path control signals for the scan paths such as shift clocks and strobe signals are inputted from the outside of the chip through a control signal input terminal 13 and supplied to each scan path through a common control signal line 9 and each selection circuit 50.

Figure 10:
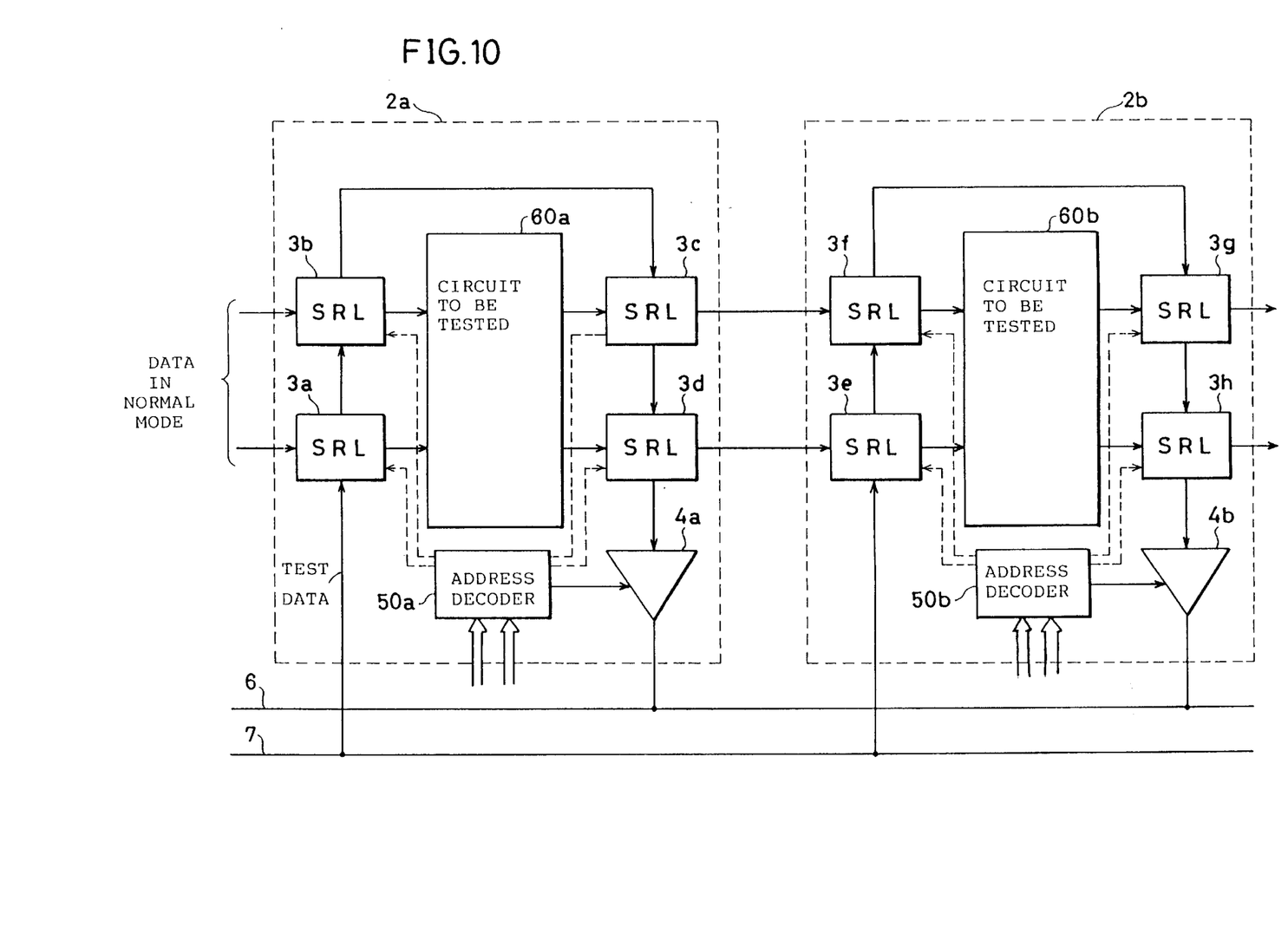
FIG. 10 is a block diagram showing the signal transmission between circuits shown in FIG. 9.

FIG. 10 is a block diagram showing in detail transmission of signals between a test circuit and a circuit to be tested in the respective module of an integrated circuit shown in FIG. 9.

Now an operation of the conventional integrated circuit shown in FIGS. 9 and 10 will be described.

In the normal mode operation, referring to FIG. 10, data to be processed passes through the SRLs 3a and 3b without being latched and is applied to the circuit 60a of the functional module 2a. Thereafter, the data processed by the circuit 60a passes through the SRLs 3c and 3d without being latched and is applied to the functional module 2b. The applied data further passes through the SRLs 3e and 3f without being latched and is applied to the circuit 60b. Thereafter, the data further processed by the circuit 60b passes through the SRLs 3g and 3h without being latched and is outputted from the functional module 2b.

In the integrated circuit shown in FIGS. 9 and 10, each functional module 2 is tested as follows. Namely, in each functional module 2, test data is serially inputted to the scan path comprised of SRLs 3 through the test data input terminal 11 and the common input signal line 7. Then, a function of each circuit 60 is tested by the test data inputted to each scan path, so that the test data output from the circuit 60 is latched in the SRL of the scan path.

More specifically, test data latched by the SRLs at the input side of each module is applied to the circuit 60 to be tested. Then, test data output from the circuit 60 is captured by the SRLs at the output side of each module. Broken lines indicate control signals for driving SRLs in FIG. 10. Thereafter, the data output is serially outputted through the common output data signal line 6 and the test data output terminal 10 to the outside of the chip. The result of such test is determined by the external determination circuit (not shown).

Since an output of each scan path is connected to the common output data signal line 6 in the above described structure, there is possibility of contention of the outputs from the scan paths on the common output data signal line 6, that is, data collision. Accordingly, in a function test, only a single scan path has to be in the enable state at all times.

Thus, any one of the scan paths is to be selected by an address signal applied from the outside of the chip through the address signal input terminal 49. Therefore, for example, in order to render only the scan path comprised of the SRLs 3a, 3b, 3c and 3d in the functional module 2a to enter the enable state, an address signal corresponding to the selection circuit 50a is inputted to the address signal line 48 through the address signal input terminal 49 to select the selection circuit 50a which is the address decoder. As a result, the tri-state buffer 4a is driven by the selection circuit 50a to enter an output enable state. An integrated circuit device is disclosed, for example, in U.S. Pat. No. 4,701,921, in which a test circuit comprising a scan path and a selection circuit is modularized and furthermore, an address decoder is employed as a selection circuit as described above.

Figure 11:
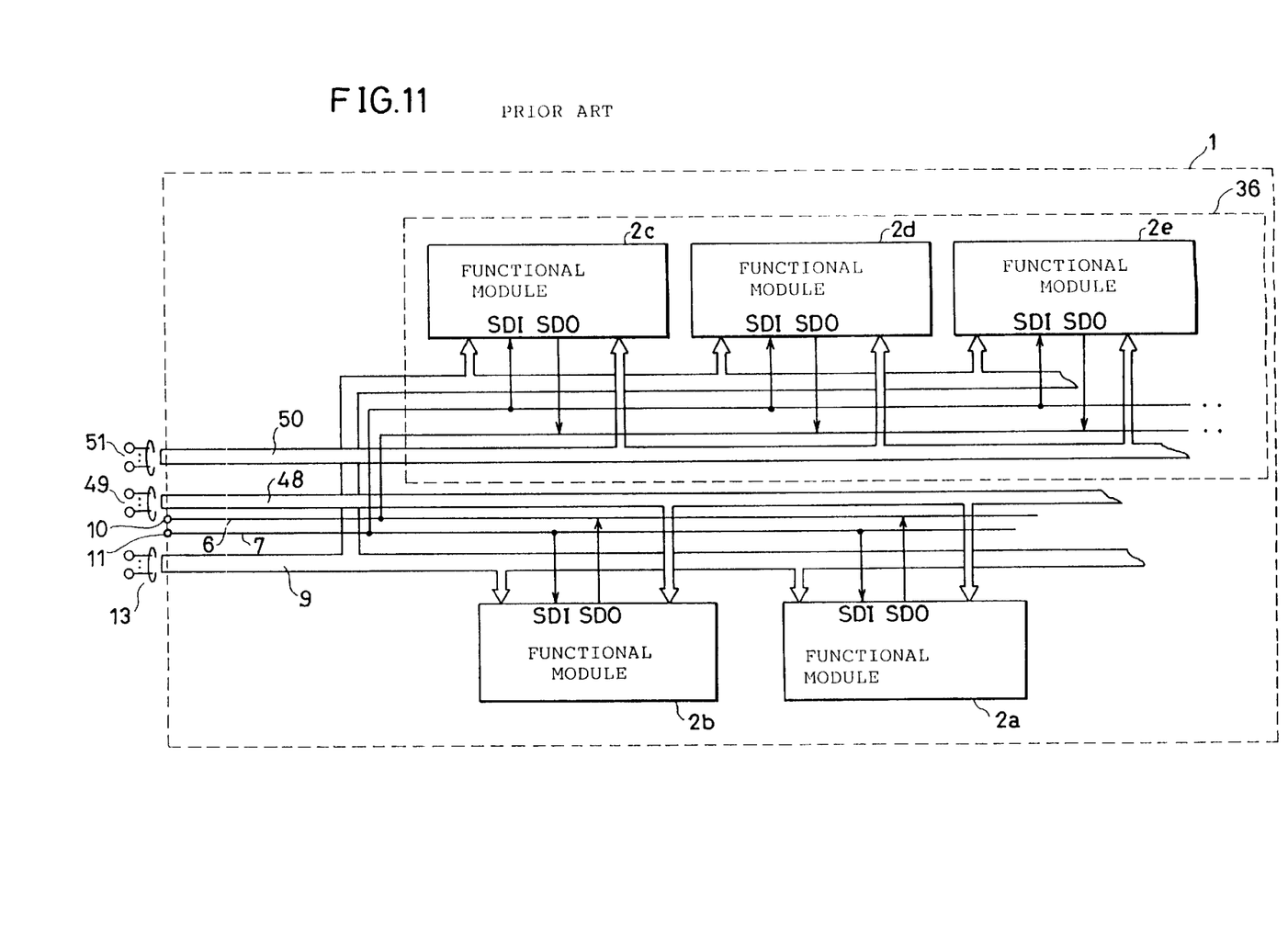
FIG. 11 is a block diagram showing another example of the conventional integrated circuit constituted by a plurality of functional modules.

FIG. 11 is a block diagram showing another example of a conventional integrated circuit comprising a plurality of functional modules.

The integrated circuit of FIG. 11 is for achieving an additional function by arranging on a chip a combination of a hierarchical functional module 36 comprising a plurality of functional modules 2c, 2d and 2e, and individual functional modules 2a and 2b. More specifically, the term "hierarchical" means a structure made by arranging a chip having a one chip layout including some modules (2c, 2d and 2e) on a new chip 1 together with some individual modules (2a and 2b).

It is assumed that each functional module comprises a test circuit including a scan path and a selection circuit, similar to the example of FIG. 9. An address signal for the hierarchical functional module 36 is inputted through an address input terminal 51 and transmitted on an address signal line 50. Address signals for the individual functional modules 2a and 2b are inputted through an address signal input terminal 49 and transmitted on an address signal line 48.

A physical layout of the hierarchical functional module 36 is determined with signal lines for a function test of each module being interconnected, and the design pattern is standardized and registered as content unchangeable (i.e., incorporated into a library of functional modules available to circuit designer). Accordingly, in such a hierarchical functional module 36, for example, the number of bits of an address signal line or the like is fixed and registered and the contents thereof can not be changed. The conventional integrated circuit device comprising such a hierarchical test circuit is disclosed in Japanese Patent Laying-Open No. 62-93672.

In the above described conventional integrated circuit, a structure of a selection circuit as an address decoder and the number of bits of an address line are determined in accordance with a circuit structure such as the number of functional modules or the like on a chip. However, in a functional module which is made into a library, the structure of the selection circuit as the address decoder and the number of bits of the address signal line are fixed and registered, and can not be changed.

Accordingly, in interconnecting signal lines for a function test of the entire integrated circuit, the output data signal line 6, the input data signal line 7 and the control signal line 9 of FIG. 11 can be used in common by the hierarchical functional modules 36 which is made into a library, and the functional modules 2a and 2b each being made into a library individually. However, it is often difficult for an address signal line for selecting a scan path of each functional module to be used in common because as shown in FIG. 11, the hierarchical functional module 36 and the individual functional modules 2a and 2b often differ in the number of bits of the address signals for selecting the scan paths.

In addition, in the functional modules 36 made into a library, each address decoder as a selection circuit in each of the modules 2c–2e is configured to the same structure. Accordingly, in case there exist on a single integrated circuit a plurality of functional modules which are made into libraries with test circuits included, the plurality of functional modules are to have the same selection circuits, so that it is highly possible that the plurality of functional modules are selected simultaneously to cause the contention of the outputs of the scan paths on an output data signal line. Therefore, it is required that the address signal line be provided separately for each module.

As the foregoing, it is not appropriate to make into a library the conventional integrated circuit having a scan path selecting means comprising an address decoder, because of the increased number of signal lines.

SUMMARY OF THE INVENTION

Therefore, an object of the present invention is to provide an integrated circuit device in which a scan path selection circuit and a selecting signal line common to each module can be used irrespective of an entire structure of the integrated circuit such as the number of modules, even if a functional module is made into a library with a test circuit included, and especially an integrated circuit device in which functional modules are suitably made into hierarchical libraries.

Another object of the present invention is to provide an integrated circuit device supporting an architecture allowing individual testing without requiring unique circuit address programming.

An integrated circuit device according to the present invention comprises a plurality of functional modules each performing a predetermined function, a terminal for supplying a signal for selecting a test module to be tested and an input/output line for transmitting test data of the functional modules. Each of the plurality of functional modules includes a test circuit belonging to the functional module for testing the same. Each test circuit comprises a scan path for receiving test data from the input/output line to supply the same to the function module, receiving a test output from the function module to hold the same, and outputting the test output to an input line; an output control circuit for controlling the output of the test output from the scan path to the input/output line; and a selecting signal holding circuit for holding a selecting signal for selectively driving the output control circuit. The respective selecting signal holding circuits in the test circuits are connected in series to form a shift register which receives the selecting signal from the selecting signal supplying terminal.

According to the integrated circuit of the present invention, a shift register is constituted as a whole by serially connecting selecting signal holding means of respective modules in order to select any one of scan paths, without using address decoders and address signals, when each functional module is made into a library with a test circuit included. Accordingly, in any integrated circuit of any circuit structure, a selection circuit of each module can be formed to be the same, so that it is possible to select a scan path by a single selecting signal line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
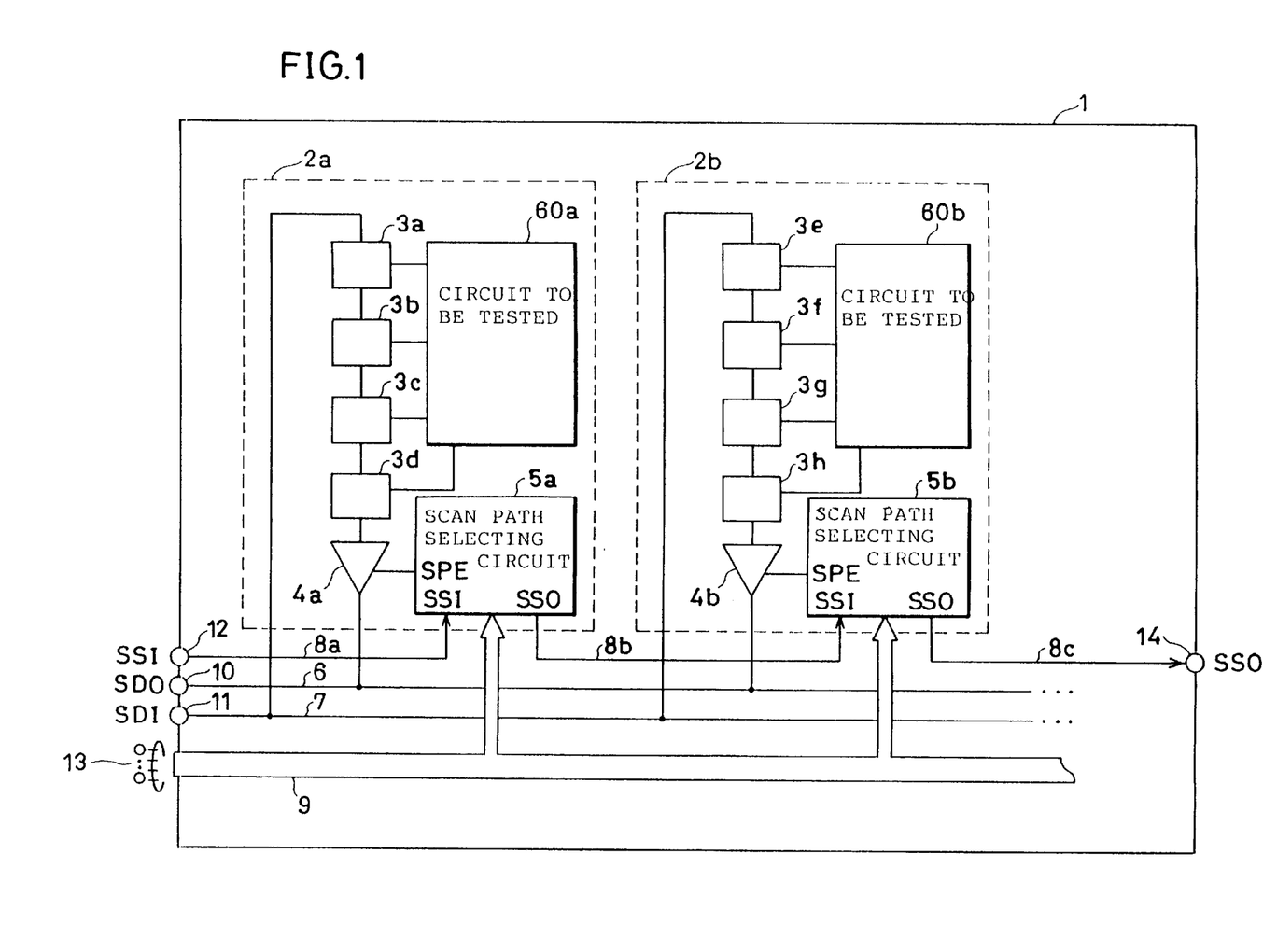
FIG. 1 is a block diagram showing an integrated circuit according to one embodiment of the present invention.

FIG. 1 is a block diagram showing an integrated circuit according to one embodiment of the present invention. The integrated circuit shown in FIG. 1 is the same as the conventional integrated circuit shown in FIG. 9 except for the following points.

Namely, in place of the selection circuits 50 each comprising the address decoder in the conventional example of FIG. 9, scan path selecting circuits 5 which will be described later are provided in the respective functional modules and are connected in series to constitute shift paths 8a–8c between a selecting signal input terminal 12 and a selecting signal output terminal 14. Such an address signal line as in FIG. 9 is not provided.

Figure 2:
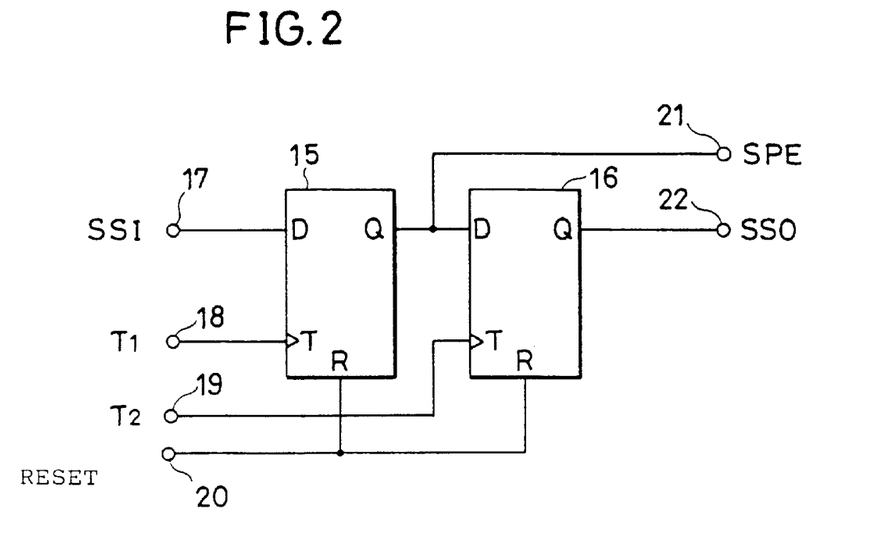
FIG. 2 is a block diagram showing a specific example of a scan path selecting circuit shown in FIG. 1.
Figure 3:
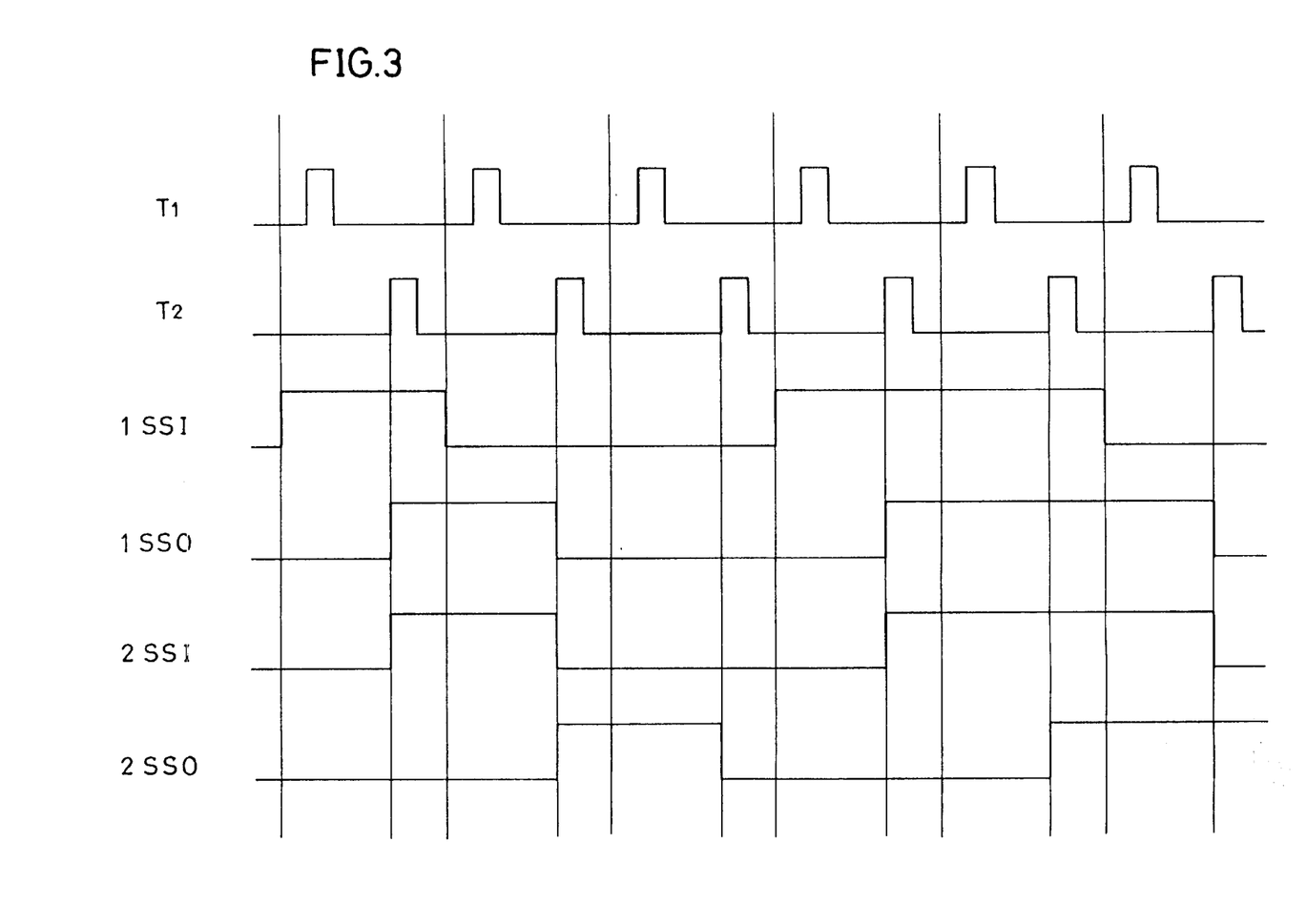
FIG. 3 is a timing chart for explaining the operation of the embodiment shown in FIGS. 1 and 2.

FIG. 2 is a block diagram showing a specific example of the scan path selecting circuit 5 shown in FIG. 1 and FIG. 3 is a timing chart for explaining the operation thereof. The scan path selecting circuit 5 shown in FIG. 2 comprises D latches 15 and 16 each having reset function, shift clock input terminals 18 and 19, a reset signal input terminal 20, a scan path enable signal output terminal 21 and a selecting data output terminal 22.

Now an operation of the embodiment shown in FIGS. 1 and 2 will be described with reference to FIG. 3. No description will be made of an operation common to that of the embodiment of FIG. 9.

In the scan path selecting circuit 5 shown in FIG. 2, the D latches 15 and 16 each having the reset function are connected in series and function as a shift register. That is, a signal held in the master latch 15 is outputted from the scan path enable terminal 21 and supplied to the output control signal line of the tri-state buffer 4 (FIG. 1). A selecting signal or test command signal SSI (FIG. 3) on the shift path 8 (FIG. 1) is inputted to the D latch 15 through a selecting data input terminal 17 and then the shift register comprising the D latches 15 and 16 performs a shift operation in response to non-overlapped two-phased clocks T1 and T2 (FIG. 3) applied through the shift clock terminals 18 and 19 from the control signal line 9 of FIG. 1. Then, the selecting signal SSO (FIG. 3) is outputted onto the shift path 8 through the selecting data output terminal 22. The data of the D latches 15 and 16 is fixed to an "L" (logical low) level in response to a reset signal inputted through the reset signal input terminal 20.

In FIG. 1, the selecting signal SSI is inputted in series to the shift path 8 through the selecting signal input terminal 12 in synchronization with the shift clocks T1 and T2. The inputted selecting signal is serial data comprises a plurality of bits, only one bit being at the "H" (logical high) level and the rest of the bits being at the "L" level. The scan path selecting circuits 5 of the respective modules are connected in series to constitute as a whole a shift register. As a result, the selecting signal of the "H" level is held at any time in any one of the scan path selecting circuits and only the output data from the corresponding scan path is applied to the common output data signal line 6. Accordingly, contention of the outputs on the common output data signal line 6 can be prevented. In addition, by shifting such serial data as described above, it is possible to sequentially select the scan path selecting circuits of the same structure. At the beginning of the test and in a normal operation of the functional modules, the scan path selecting circuit are reset to cause all the scan paths to enter in a no-selected state. As a result, the outputs are prevented from contending on the common output data signal line 6.

Figure 4:
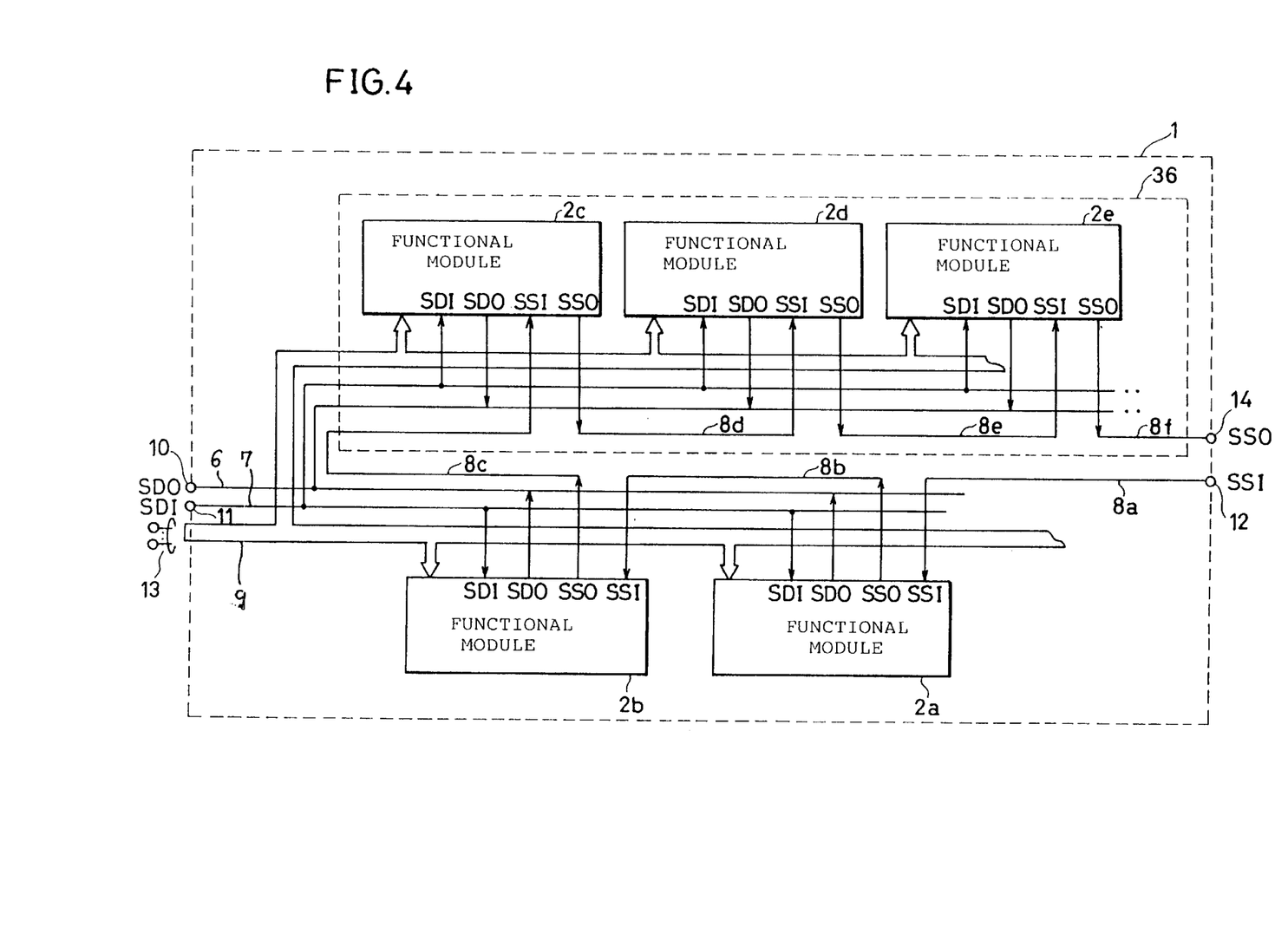
FIG. 4 is a block diagram showing one example of an integrated circuit in which functional modules having test circuits as shown in FIGS. 1 and 2 are hierarchically made into library.

FIG. 4 is a block diagram showing one example of an integrated circuit wherein functional modules each having a test circuit according to the present invention as shown in FIGS. 1 and 2 are made into hierarchical libraries. The integrated circuit shown in FIG. 4 is the same as the conventional integrated circuit shown in FIG. 11 except for the following points. Namely, while in the conventional example of FIG. 11, more than two systems of the address signal lines are required for selecting the scan paths, the integrated circuit of FIG. 4 according to the present invention requires one system of shift paths 8a–8d for constituting a signal selecting line for the scan paths.

As the foregoing, according to one embodiment of the present invention, each scan path selecting circuit 5 constituting the test circuit has the same structure in all the functional modules irrespective of the structures of the functional modules themselves and the structure of the entire integrated circuit. In addition, all the test circuits are provided individually in the respective functional modules. As a result, it is possible to make the functional modules into libraries with the test circuits included, which results in a great advantage in designing and in use for manufacturers and users of the integrated circuits. In addition, since the selecting signal line of the scan path is always formed of a single shift path, it is possible to prevent the increase of the interconnection region and the number of test pins. Furthermore, a manner of connecting the signal lines is simple, so that it is effectively made into a computer aided design (CAD).

Figure 5:
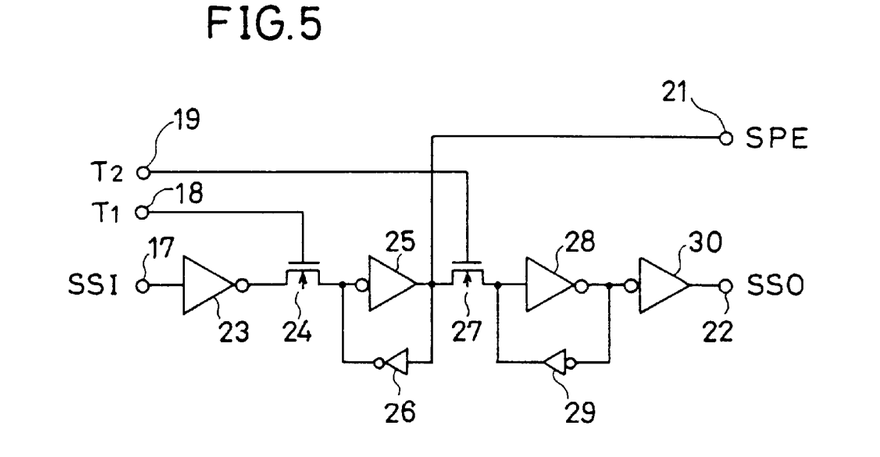
FIG. 5 is a block diagram showing another specific example of the scan path selecting circuit shown in FIG. 1.

FIG. 5 is a block diagram showing another specific example of the scan path selecting circuit 5 shown in FIG.

1. The scan path selecting circuit 5 of FIG. 5 comprises inverters 23, 25, 26, 28, 29 and 30, in which the inverters 25 and 26 constitute a master latch and the inverters 28 and 29 constitute a slave latch of the shift register. The scan path selecting circuit also comprises transmission gates 24 and 27 of n channel transistors, and accordingly, the above described latches constituting the shift register perform a shift operation in response to the non-overlapped two-phased clocks T1 and T2 inputted through the shift clock input terminals 18 and 19. Then, the data held in the above described latches can be reset by fixing both the two-phased clocks T1 and T2 to the "H" level and the selecting signal SSI applied to the selecting data input terminal 17 to the "L" level.

Figure 6:
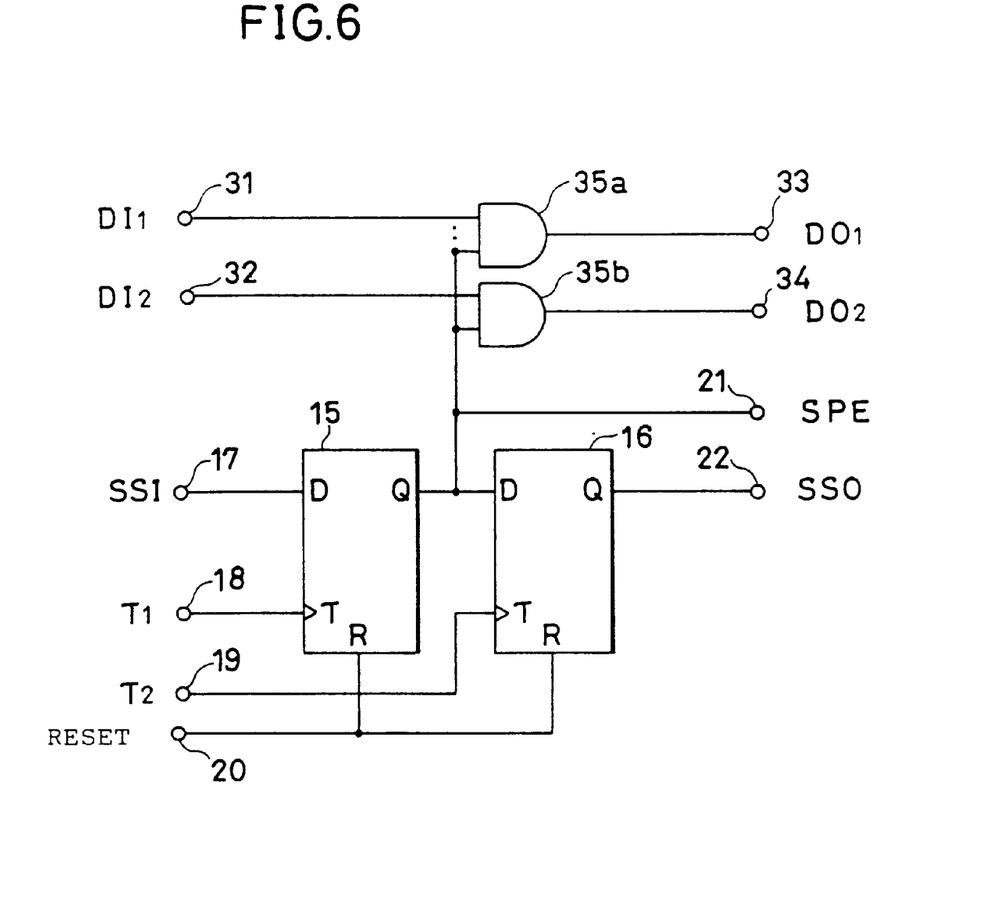
FIG. 6 is a block diagram showing a further specific example of the scan path selecting circuit shown in FIG. 1.

FIG. 6 is a block diagram showing a further example of the scan path selecting circuit 5 shown in FIG. 1. The scan path selecting circuit shown in FIG. 6 is obtained by adding two AND gates 35*a* and 35*b* to that shown in FIG. 2. Namely, the signal to be held in the D latch 15 is applied to one input of each of the AND gates 35*a* and 35*b* and control signals DI1 and DI2 including a shift clock for a scan path or the like are applied to the other input of each of the gates from the control signal line 9 of FIG. 1 through control signal input terminals 31 and 32. Outputs of the AND gates 35*a* and 35*b* are outputted as control signals DO1 and DO2 through control signal output terminals 33 and 34, respectively, and supplied to the scan path. Namely, switching of the AND gates 35*a* and 35*b* are controlled by the selecting signal held in the master latch 15 and in case the scan path is not selected, these AND gates are closed, so that no control signal such as a shift clock is supplied to the scan path. Such a scan path selecting circuit as shown in FIG. 6 also invalidates the control signal in the corresponding function module in order to eliminate undesired effect on a test of the other functional modules, when the operation of the corresponding functional module is not desired during the test of the other functional modules.

Figure 7:
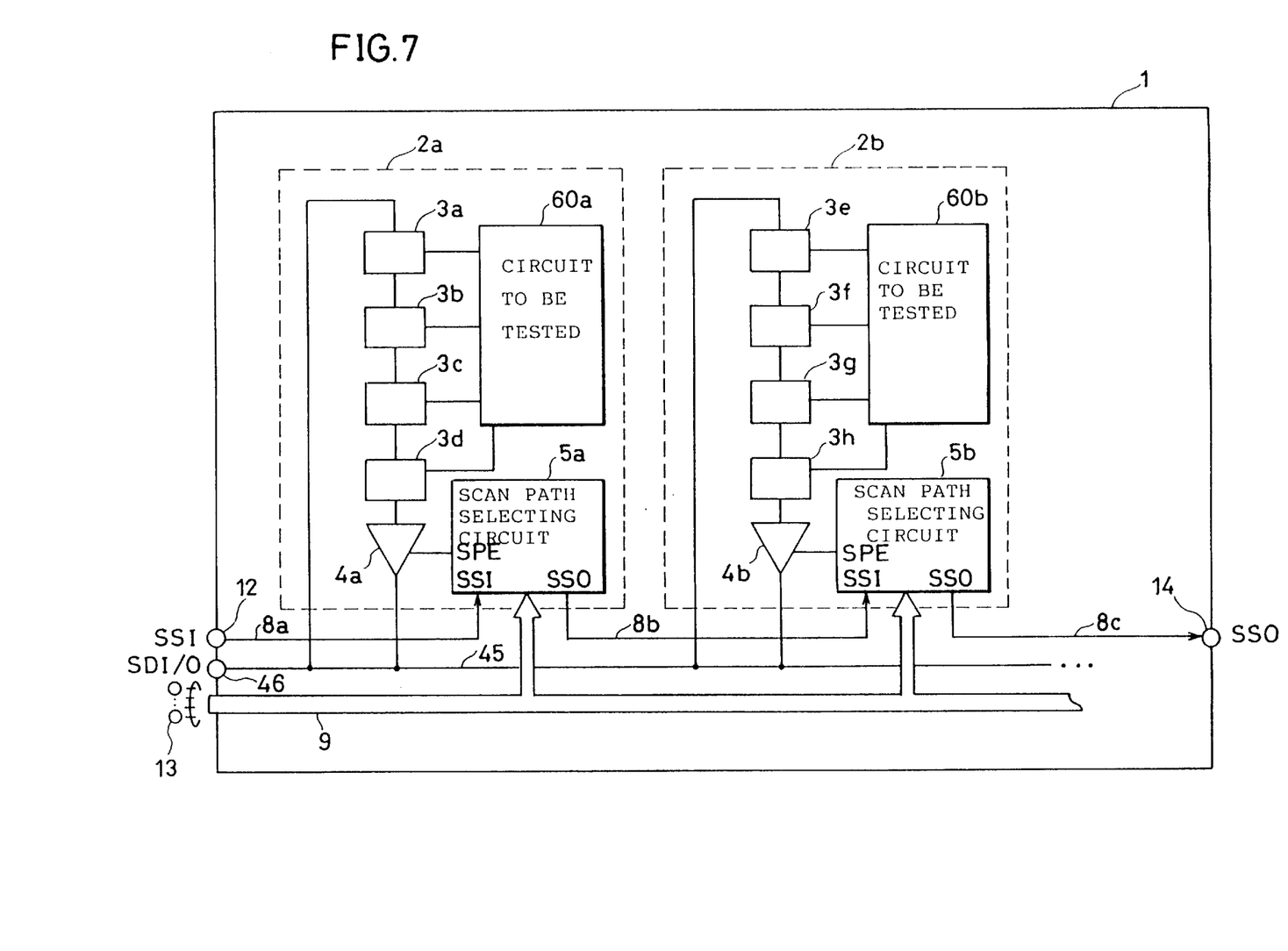
FIG. 7 is a block diagram showing an integrated circuit according to another embodiment of the present invention.

FIG. 7 is a block diagram showing an integrated circuit according to another embodiment of the present invention. The integrated circuit shown in FIG. 7 is the same as that of the embodiment shown in FIG. 1 except for the following points. Namely, while in the embodiment of FIG. 1, the input/output terminal of the test data and the signal line are provided separately, in the embodiment of FIG. 7, a common test data input/output terminal 46 and a common test data signal line 45 are provided. The SRLs 3 perform a shift operation in response to the non-overlapped two-phased clocks supplied through the control signal line 9. The test data is transmitted on the common test data input/output signal line 45, in synchronization with the two-phased shift operation. In the embodiment of FIG. 7, since input and output of the test data to and from the scan path are controlled by the non-overlapped shift clocks T1 and T2, no problem arises in practice even if data input/output signal line is used in common. As a result, an interconnection region of the signal line can be further reduced.

Figure 8:
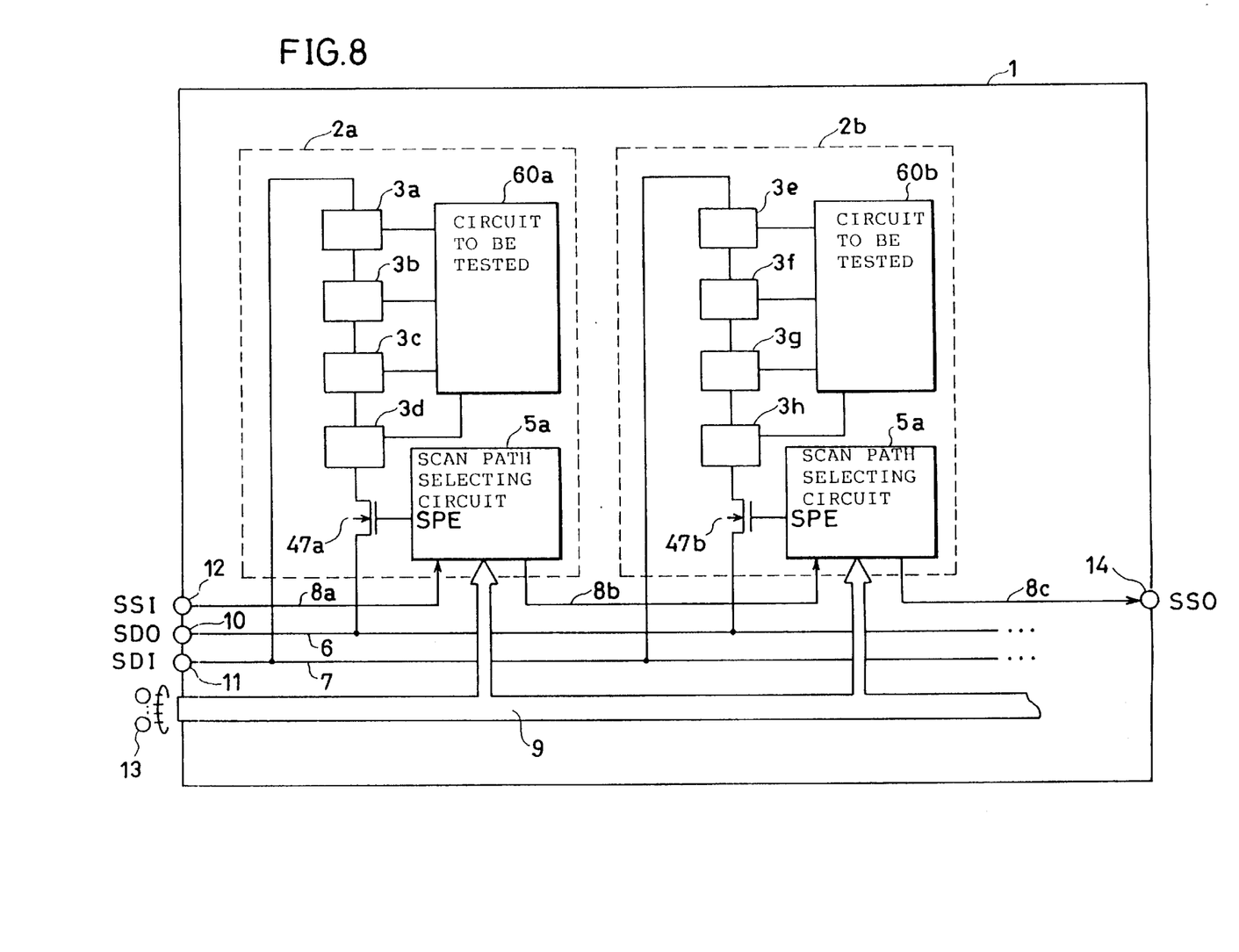
FIG. 8 is a block diagram showing an integrated circuit according to a further embodiment of the present invention.

FIG. 8 is a block diagram showing an integrated circuit according to a further embodiment of the present invention. The integrated circuit shown in FIG. 8 employs transmission gates 47*a* and 47*b* of n channel transistors in place of the tri-state buffers 4*a* and 4*b* shown in FIG. 1.

As the foregoing, according to the present invention, by providing selecting signal holding means of the same structure in respective functional modules and connecting the same in series to constitute a shift register as a whole, structures of a selecting circuit of each functional module and a selecting signal line can be fixed, so that the functional module can be made into a library, resulting in a great advantage for the manufacturers and users of the integrated circuit in designing and using the same. In addition, since the selecting signal line of the scan path can be formed of a single shift path at any time, the interconnection region can be further reduced.

Meanwhile, the present invention is applicable not only to an integrated circuit device having a hierarchical structure formed by arranging modules on a chip but also to another circuit device having a hierarchical structure formed by arranging chips on a board.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated circuit device for performing a predetermined function, comprising:

a plurality of functional modules each for performing a predetermined function;

means for supplying a signal for selecting a functional module to be tested out of said plurality of functional modules, only a single functional module being tested at once among said plurality of functional modules;

a single common input line means and a single common output line means for transmitting test data to said functional modules, each functional module including a test circuit belonging to a corresponding functional module for testing the test data, with each test circuit including;

scan path means for receiving said test data from said single common input line means to said functional module, said scan path means receiving a test output from said functional module and holding the test data, and outputting said test output to said single common output line means;

output controlling means for controlling the output of said test output from said scan path means to said single common output line means, each of said output controlling means being connected to said single common output line means in parallel; and selecting signal holding means comprising a single latch for holding said selecting signal for selectively driving said output controlling means, wherein the latches of said selecting signal holding means of the respective test circuits are connected in series to another selecting signal holding means of another test circuit to constitute shift register means receiving said selecting signal from said selecting signal supplying means, and each of said single latch selects one of said scan path means;

whereby a plurality of said output controlling means from said functional modules connected to said single common output line means in parallel, said plurality of said output controlling means contention for said single common output line means upon a normal start up or test operation of said functional modules;

said integrated circuit device further comprising reset means for preventing said single common output line means contention by plurality of said output controlling means, said reset means including;

(a) means for receiving a reset signal, and supply the reset signal simultaneously to each of said output controlling means; and (b) means responsive to said reset signal for disabling said output controlling means from outputting the test output.

2. An integrated circuit device according to claim 1, wherein said scan path means comprises a plurality of series connected shift register latches.

3. An integrated circuit device according to claim 1, wherein said selecting signal inputted to said shift register means is serial data of a plurality of bits, only one bit thereof having a logical value for selectively driving said output control circuit.

4. An integrated circuit device according to claim 1, further comprising:
   means for supplying a control signal for controlling an operation of said scan path means, and
   a common control signal line for transmitting said control signal to the respective functional modules.

5. An integrated circuit device according to claim 4, wherein each of said test circuits comprises means for supplying said control signal to said scan path means only when it is selected by said selecting signal.

6. An integrated circuit device according to claim 1, wherein said output control means comprises a tri-state buffer.

7. An integrated circuit device according to claim 1, wherein said output control means comprises a transmission gate.

8. An integrated circuit device according to claim 1, wherein at least a part of said plurality of functional modules constitutes a hierarchical functional module.

9. An integrated circuit device according to claim 1, wherein each of said test circuits includes reset means for resetting said selecting signal holding means to a predetermined logical value.

10. An integrated circuit device according to claim 9, wherein said output controlling means are responsive to said predetermined logical value to inhibit the outputs of respective test outputs from said scan path means to said single common output line means.

11. An integrated circuit device according to claim 1 wherein said scan path means of each of said test circuits are connected to continuously receive said test data from said single common input line means irrespective of said selecting signal held by a respective one of said selecting signal holding means.

12. A circuit device having a hierarchical structure selectively operable in an operational mode for performing a predetermined function and in a test mode for selectively testing subfunctions constituting said function, said circuit device comprising:
   a plurality of functional modules each operable in said operational mode for performing one of said subfunctions of said predetermined function and selectively operable in said test mode in response to a test command signal for performing a test of a respective functional module, only a single functional module being tested at once among said plurality of functional modules;
   means for supplying said test command signal for selectively controlling said test mode of each of said plurality of functional modules;
   a single common input line means and a single common output line means for transmitting test data to said plurality of functional modules, said plurality of functional modules each including a test circuit for testing the respective functional module in response to said test command signal, each test circuit including:
   (a) scan path means for (i) receiving said test data from said single common input line means to a respective functional module, (ii) said scan path means receiving a test output from said respective functional module and holding the test data, and (iii) outputting said test output to said single common output line means;
   (b) output control means for controlling the output of said test output from said scan path means to said single common output line means, each output control means being connected to said single common output line means in parallel; and
   (c) test command signal holding means comprising a single latch for holding said test command signal and, in response, selectively enabling said output control means, wherein the latches of said test command signal holding means of the respective test circuits are connected in series to another test command signal holding means of another test circuit to constitute shift register means receiving said test command signal from said test command signal supplying means, each of said single latch selects one of said scan path means;
   whereby a plurality of said output control means connected to said single common output line means in parallel, said plurality of said output control means contention for said single common output line means upon a normal start up or test operation of said functional modules;
   said circuit device further comprising reset means for preventing said single common output line means contention by plurality of said output control means, said reset means including;
   (a) means for receiving a reset signal, and supply the reset signal simultaneously to each of said output control means; and
   (b) means responsive to said reset signal for disabling said output control from outputting the test output means.

13. A circuit device according to claim 12 wherein said scan path means of each of said test circuits is connected to continuously receive said test data from said single common input line means.

14. A circuit device having a hierarchical structure selectively operable in an operational mode for performing a predetermined function and in a test mode for selectively testing externally specified subfunctions, said predetermined function comprising at least one of said subfunctions, said circuit device comprising:
   a plurality of functional modules each selectively operable in response to a test command signal (a) in said operational mode for performing a predetermined one of said subfunctions of said predetermined function and (b) in said test mode for testing a respective subfunction, only a single functional module being tested at once among said plurality of functional modules;
   test command control means for supplying said test command signal for selectively controlling said test mode of each of said plurality of functional modules;
   a single common input line means and a single common output line means for transmitting test data to said plurality of functional modules, said plurality of functional modules each including a test circuit for testing a respective functional module in response to said test command signal, each test circuit including:
   (a) scan path means for (i) receiving said test data from said single common input line means to a respective functional module, (ii) said scan path means receiving a test output from said respective functional module and holding the test data, and (iii) outputting said test output to said single common output line means, (b) output controlling means for controlling the output of said test output from said scan path means to said single common output line means, each of said output controlling means being connected to said single common output line means in parallel; and (c) test command signal holding means including a single latch for holding said test command signal and selectively enabling said output control means, wherein the latches of said test command signal holding means of the respective test circuits are connected in series to another test command signal holding means of another test circuit to constitute shift register means receiving said test command signal from said test command control means, each of said single latch one of said scan path means;

whereby a plurality of said output controlling means connected to said single common output line means in parallel, said plurality of said output controlling means contention for said single common output line means upon a normal start up or test operation of said functional modules;

said circuit device further comprising reset means for preventing said single common output line means contention by plurality of said output controlling means, said reset means including;

(a) means for receiving a reset signal, and supply the reset signal simultaneously to each of said output controlling means; and (b) means responsive to said reset signal for disabling said output controlling means from outputting the test output.

15. A circuit device according to claim 14, wherein said device is operable in said test mode wherein a selected one of said functional modules which is to be tested is enabled in response to said test command signal to receive said test data from said single common input line means and to supply said test output to said single common output line means and others of said functional modules are selectively operable in response to said test command signal whereby said functional modules are selectively disabled from supplying said test data output to said single common output means.

16. A circuit device according to claim 14, wherein said output controlling means of each said functional modules includes bypass means responsive to said test command signal for selectively bypassing test data around a respective functional module whereby said test data is not thereby supplied to said single common output line means.

17. A circuit device having a hierarchical structure, comprising:

a plurality of functional modules;

input means for receiving a test command signal for selectively controlling a test mode of each of said plurality of functional modules, only a single functional module being tested at once among said plurality of functional modules;

shifting means for shifting said test command signal through said plurality of functional modules;

a single common input line means and a single common output line means for transmitting test data to said functional modules, each functional module including (i) scan path means for receiving said test data from said single common input line means and applying said test data to said functional module, output controlling (ii) means for generating a test output in response to said test data, (iii) select signal holding means including a single latch for holding a single bit, and (iv) switch means responsive to said single bit held in said single latch for selectively outputting said test output to said single common output line means in response to said test command signal, each of said switch means being connected to said single common output line means in parallel, wherein each of said single latch selectively outputs said test output of a single functional module;

whereby a plurality of said switch means from said functional modules connected to said single common output line means in parallel, said plurality of said switch means contention for said single common output line means upon a normal start up or test operation of said functional modules;

said circuit device further comprising reset means for preventing said single common output line means contention by plurality of said switch means, said reset means including;

(a) means for receiving a reset signal, and supply the reset signal simultaneously to each of said switch means; and (b) means responsive to said reset signal for disabling said switch means from outputting the test output.

18. A method for testing a circuit device including;

a plurality of functional modules forming a hierarchical structure, each functional module having a scan path means connected to a single common input line means and a single common output line means for transmitting test data to said functional modules and including a single latch circuit connected in series with latch circuits of others of said plurality of functional modules to form a shift register with each single latch circuit selecting a single scan path means for outputting a test output to the single common output line means via an output controlling means, each of said output controlling means being connected to said single common output line means in parallel, whereby a plurality of said parallel connected output controlling means contention for said single common output line means upon a normal start up or test operation of said functional modules, and said circuit device further comprising reset means for preventing said single common output line means contention by plurality of said output controlling means, said reset means including;

(a) means for receiving a reset signal, and supply the reset signal simultaneously to each of said output controlling means, (b) means responsive to said reset signal for disabling said output controlling means from outputting the test output by resetting the output state of each single latch circuit, the method comprising the steps of:

instantly setting each single latch to an initial state in response to said reset signal, said initial state of each single latch disabling the output state of a corresponding output controlling means from said functional modules;

supplying a test command signal for selectively controlling a test mode of each one of said plurality of functional modules, only a single functional module being tested at once among said plurality of functional modules;

selectively shifting said test command signal through said plurality of functional modules; and transmitting said test data to said plurality of functional modules on said single common input line means, each functional module (i) receiving said test data into said scan path means and applying said test data to said functional module, (ii) generating the test output in response to said test data, and (iii) selectively outputting said test output to said single common output line means via said output controlling means in response to said test command signal stored in the respective single latch circuit.

19. A method for testing a circuit device including;

a plurality of functional modules forming a hierarchical structure, each of the functional modules having a scan path means connected to a single common input line means and a single common output line means for transmitting test data to said functional modules and including a single latch circuit connected in series with latch circuits of others of said plurality of functional modules to form a shift register with each single latch circuit selecting a single scan path means for providing a respective test output to the single common output line means via an output controlling means, each of said output controlling means being connected to said single common output line means in parallel, whereby a plurality of said parallel connected output controlling means contention for said single common output line means upon a normal start up or test operation of said functional modules, and said circuit device further comprising reset means for preventing said single common output line means contention by plurality of said output controlling means, said reset means including;

(a) means for receiving a reset signal, and supply the reset signal simultaneously to each of said output controlling means, and (b) means responsive to said reset signal for resetting said output controlling means from outputting the test output by resetting the output state of each single latch circuit, the method comprising the steps of:

when power is initially applied, instantly setting each single latch to an initial state in response to said reset signal, said initial state of each single latch disabling the output state of a corresponding output controlling means from said functional modules;

supplying a test command signal for selectively controlling a test mode of each one of said plurality of functional modules, only a single functional module being tested at once among said plurality of functional modules;

selectively shifting said test command signal through said plurality of functional modules to provide a definite value from only a single scan path means to said single common output line means while setting the outputs of the other scan path means to a high impedance state; and transmitting test data to said plurality of functional modules on said single common input line means, each functional module (i) receiving said test data into said scan path means and applying said test data to said functional module, (ii) generating said test output in response to said test data, and (iii) selectively outputting said test output to said single common output line means in response to said test command signal stored in the respective single latch circuit.

* * * * *